US 7,141,791 B2

(12) United States Patent
Masnaghetti et al.

(10) Patent No.: US 7,141,791 B2
(45) Date of Patent: Nov. 28, 2006

(54) APPARATUS AND METHOD FOR E-BEAM DARK FIELD IMAGING

(75) Inventors: Douglas K. Masnaghetti, San Jose, CA (US); Eric Munro, London (GB); Gabor D. Toth, San Jose, CA (US); Jeffrey Keister, Port Jefferson, NY (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/935,834

(22) Filed: Sep. 7, 2004

(65) Prior Publication Data

US 2006/0060780 A1    Mar. 23, 2006

(51) Int. Cl.
*G01N 23/00* (2006.01)

(52) U.S. Cl. .................................................... 250/311

(58) Field of Classification Search ................ 250/310, 250/306, 307, 397, 305
See application file for complete search history.

(56) References Cited

U.S. PATENT DOCUMENTS

| 5,424,541 | A | * | 6/1995 | Todokoro et al. ........... 250/310 |
| 5,644,132 | A | * | 7/1997 | Litman et al. .............. 250/310 |
| 6,407,373 | B1 | | 6/2002 | Dotan |
| 6,667,476 | B1 | * | 12/2003 | Todokoro et al. ........... 250/310 |
| 6,872,944 | B1 | * | 3/2005 | Todokoro et al. ........... 250/310 |
| 6,885,001 | B1 | * | 4/2005 | Ose et al. .................. 250/310 |

* cited by examiner

*Primary Examiner*—Nikita Wells
*Assistant Examiner*—Johnnie L Smith, II
(74) *Attorney, Agent, or Firm*—Okamoto & Benedicto LLP (57) ABSTRACT

One embodiment disclosed relates to a scanning electron beam apparatus including an objective lens, scan deflectors, de-scan deflectors, an energy-filter drift tube, and a segmented detector. The objective lens may be an immersion lens configured with a high extraction field so as to preserve azimuthal angle discrimination of the electrons scattered from the specimen surface. The de-scan deflectors may be used to compensate for the scanning of the incident electron beam. The energy-filter drift tube is configured to align the scattered electrons according to polar angles of trajectory from the specimen surface.

25 Claims, 8 Drawing Sheets

FIG. 1
(Conventional)

FIG. 2
(Conventional)

FIG. 3
(Conventional)

APPARATUS AND METHOD FOR E-BEAM DARK FIELD IMAGING

BACKGROUND OF THE INVENTION

1. Field of the Invention

The present invention relates to apparatus and methods for electron beam imaging.

2. Description of the Background Art

The two most common types of electron microscopes available commercially are the scanning electron microscope (SEM) and the transmission electron microscope (TEM). In an SEM, the specimen is scanned with a focused beam of electrons which produce secondary and/or backscattered electrons as the beam hits the specimen. These are detected and typically converted into an image of the surface of the specimen. Specimens in a TEM are examined by passing the electron beam through them, revealing more information of the internal structure of specimens.

Bright field imaging and dark field imaging are often used in the context of TEMs. A bright field image may be formed in a TEM by selecting electrons from a central diffraction spot to form the image. A dark field image may be formed in a TEM by selecting some or all of the (non-central) diffracted electrons to form the image. The selection of electrons may be implemented using an aperture into the back focal plane of the objective lens, thus blocking out most of the diffraction pattern except that which is visible through the aperture.

Dark field imaging are typically less commonly used in SEMs. SEM dark-field detection systems may be categorized as below-the-lens detectors or behind-the-lens detectors.

Figure 1:
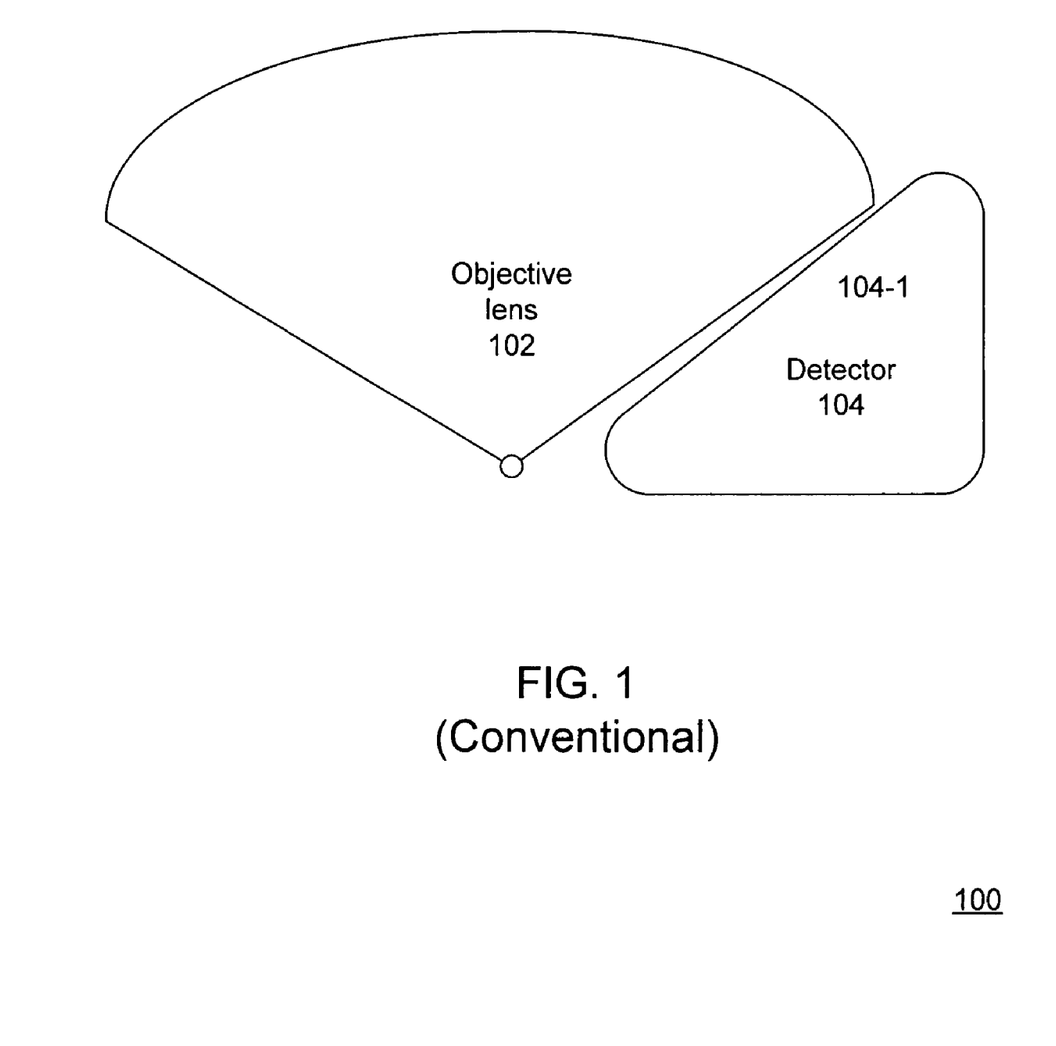
FIG. 1 is a depiction of a conventional SEM dark field detection system with a below-the-lens configuration.
Figure 2:
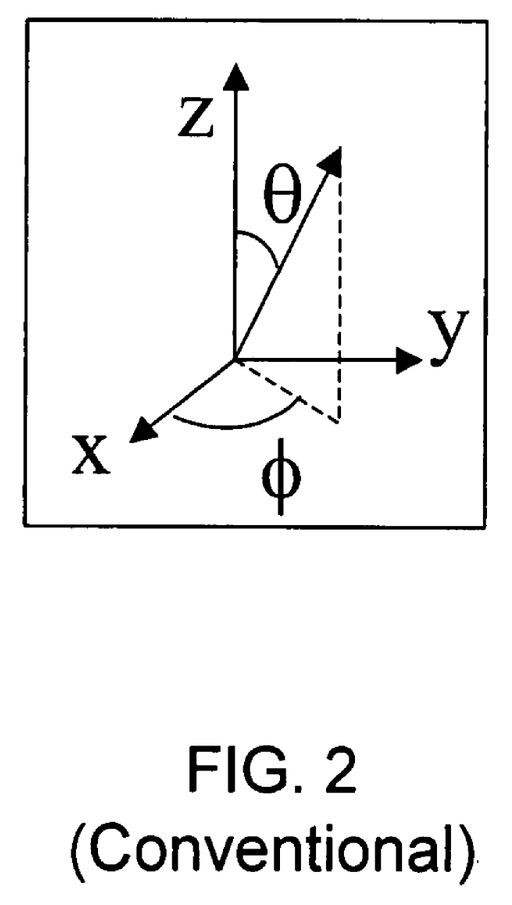
FIG. 2 is a diagram depicting a conventional definition of angles.

A conventional SEM dark field detection system with a below-the-lens configuration 100 is depicted in FIG. 1. In a below-the-lens configuration 100, the detectors 104 are positioned below the objective lens 102 at the bottom of the electron beam column (near the specimen). Unfortunately, immersion objective lens technology interferes with the collection efficiency of below-the-lens detectors 104. Thus, non-immersion objective lens designs are typically used, resulting in higher lens aberration coefficients and leading to inferior image resolution. In addition, the polar angle discrimination threshold is not well controlled for such below-the-lens detectors 104 because the electron energy and emission azimuth can affect the polar angle acceptance of the detector 104. The definitions of the polar angle $\theta$ and azimuth angle $\phi$ in relation to the scattered electrons emitted from the specimen are shown by illustration in FIG. 2.

Figure 3:
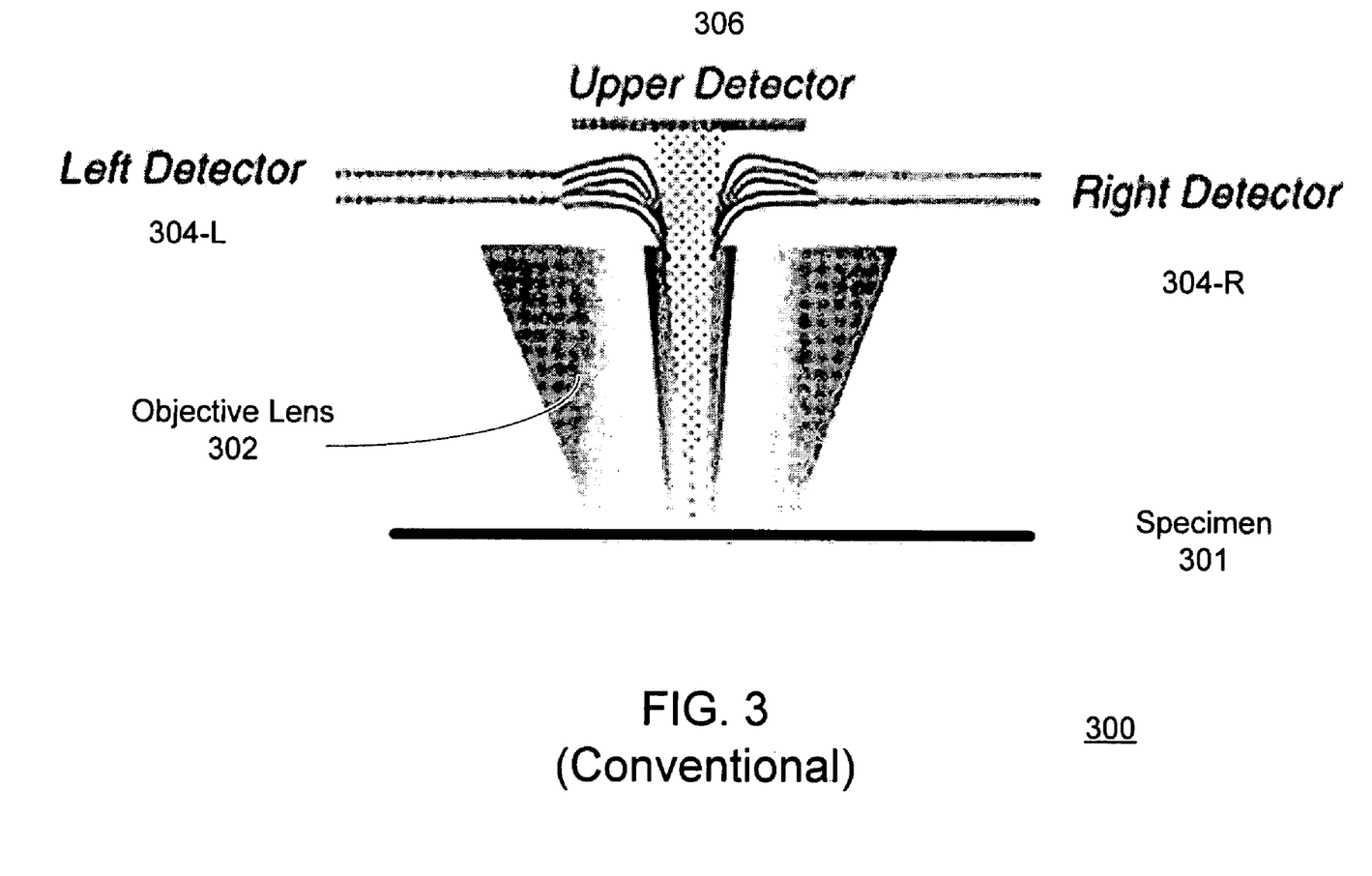
FIG. 3 is a schematic diagram of a conventional SEM dark field detection system with a behind-the-lens configuration.

A schematic diagram of a conventional SEM dark field detection system with a behind-the-lens configuration 300 is depicted in FIG. 3. A typical behind-the-lens configuration 300 uses off-axis detectors 304 similar to those shown in FIG. 3. These detectors 304 are located "behind" the objective lens 302. In other words, the detectors 304 are located above and to the sides of the objective lens 302 in the electron beam column. The behind-the-lens configuration 300 allows the use of immersion objective lens technology, but unfortunately the behind-the-lens configuration 300 typically has poor polar angle discrimination. In addition, polar angle acceptance is sensitive to primary beam landing energy and beam scanning.

Another behind-the-lens approach uses a segmented detector in conjunction with a Wien filter. Immersion lens technology can be used with this approach, but the approach is sensitive to beam scanning and provides only poor azimuth discrimination and little or no polar angle discrimination.

SUMMARY

One embodiment of the invention relates to a scanning electron beam apparatus including an objective lens, scan deflectors, de-scan deflectors, an energy-filter drift tube, and a segmented detector. The objective lens may be an immersion lens configured with a high extraction field so as to preserve azimuthal angle discrimination of the electrons scattered from the specimen surface. The de-scan deflectors may be used to compensate for the scanning of the incident electron beam. The energy-filter drift tube is configured to align the scattered electrons according to polar angles of trajectory from the specimen surface.

DETAILED DESCRIPTION

It is desirable to provide an SEM system with dark-field and bright-field imaging capabilities. It is further desirable for the system architecture to be designed to preserve the image resolution provided by an immersion lens without sacrificing dark-field image capability.

Figure 4:
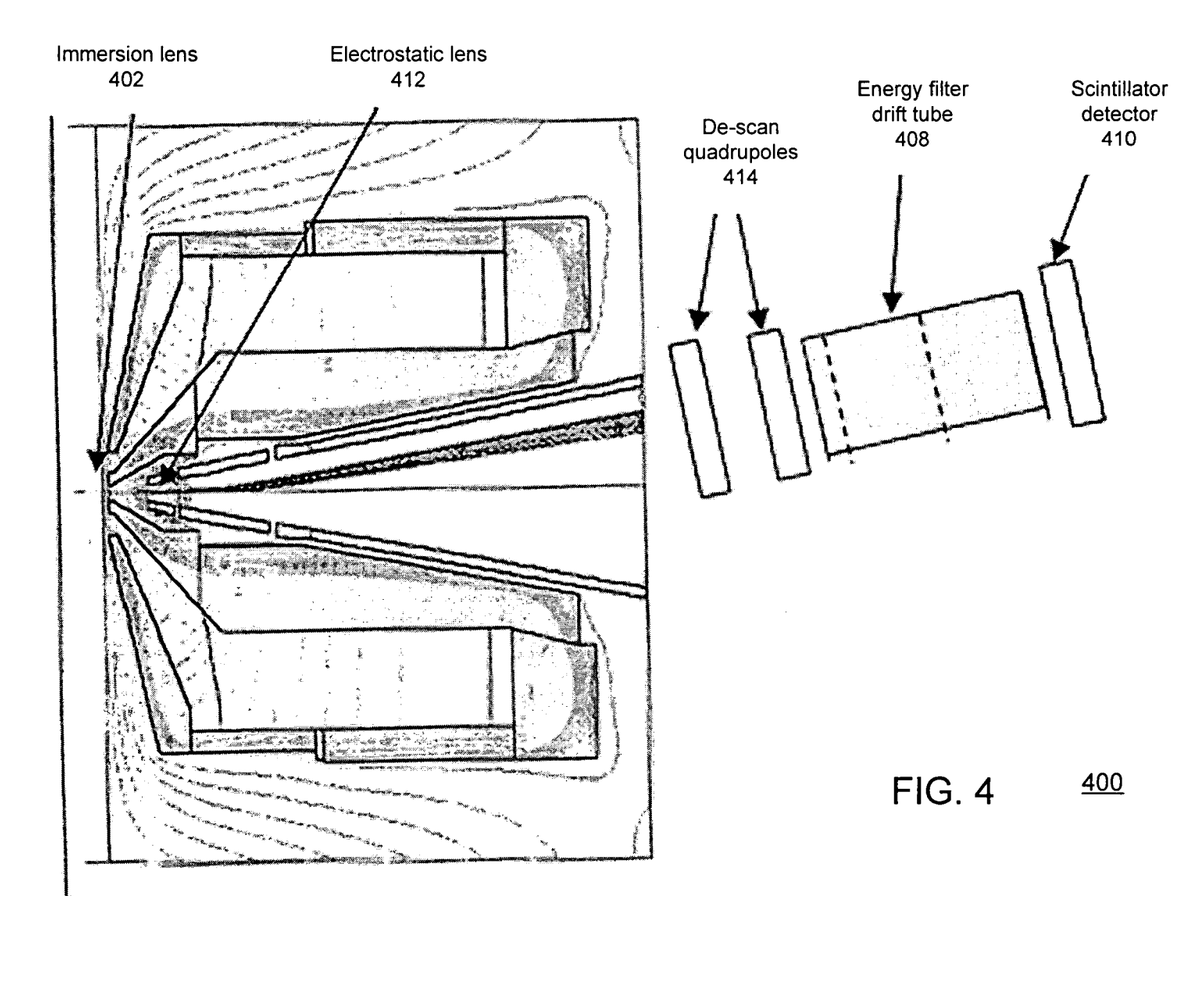
FIG. 4 is a cross-sectional schematic diagram of the SEM dark field imaging system in accordance with an embodiment of the invention.

FIG. 4 is a diagram of an SEM dark field imaging system 400 with an improved behind-the-lens detection configuration in accordance with an embodiment of the invention. For purposes of explanation of the figure, certain components of the system are pointed to specifically. At the bottom of the figure, the immersion lens pole pieces 402 are shown. Next going up the column are the scan plates 404 and Wien filter 406. Towards the top, a scintillator detector 410 is shown, with an energy filter component 408 in front of the detector 410.

Depicted in FIG. 4 are various select components, including an immersion objective lens 402, an electrostatic lens 412, de-scan quadrupole lenses 414, the energy filter drift tube 408, and the scintillator detector 410.

The immersion lens 402 may be configured with a high extraction field so as to preserve azimuthal angle discrimination. However, good polar angle discrimination requires equalizing the radial spread of different energy electrons. Slowing the electrons to their "native" energies for a period of time allows for equalizing the radial spread. This is because the lowest energy electrons would have the longest transit time to allow their radial velocity component to spread them more than the higher energy electrons. In accordance with an embodiment of the invention, the energy filter 408 may be configured to align the secondary electron polar angles across the secondary electron energy spectrum. This may be done by using a drift tube configuration to allow radial spreading of the electrons as a function of their axial energy.

The electrostatic lens 412 is a lens that may be configured to control the imaging path beam divergence. In other words, the strength of the electrostatic lens 412 may be adjusted to control the cone angle of the scattered electrons to preferably keep the cone angle constant. Alternatively, the electrostatic lens 412 may be positioned in the path of the scattered electrons immediately prior to or after the energy filter drift tube 408.

Figure 5A:
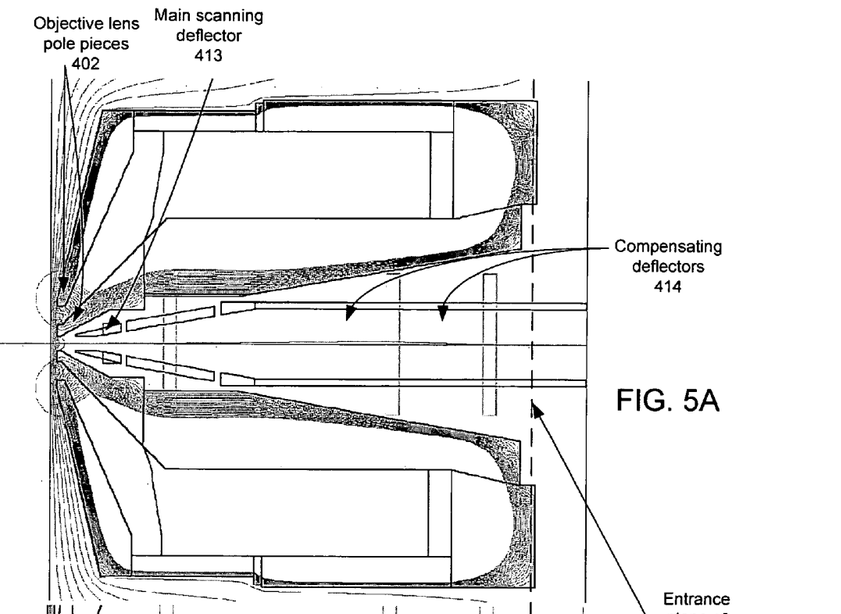
FIG. 5A is a cross-sectional diagram showing the scanning deflectors and compensating deflectors in the SEM dark field imaging system in accordance with an embodiment of the invention.

The de-scan quadrupole lenses 414 comprise compensating deflectors that compensate for the scanning performed by the main scanning deflector 413 (shown in FIG. 5A). In alternate embodiments, the de-scan lenses may comprise octopole, or sextupole, or other multipole lenses. The detector 410 may comprise a YAP scintillator with segmented light pipe.

Figure 5B:
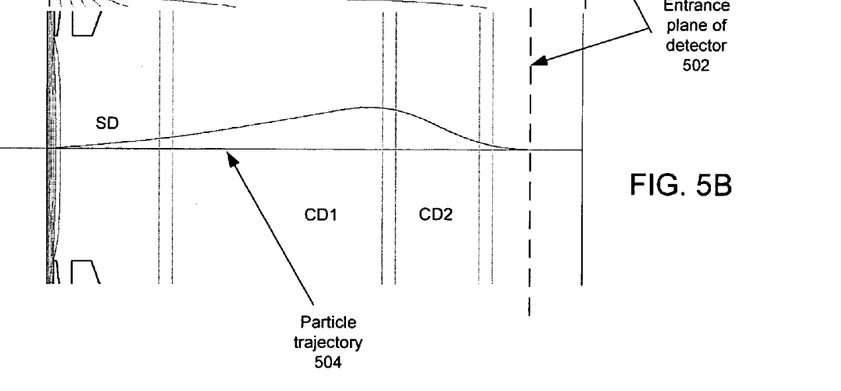
FIG. 5B is a diagram that an electron trajectory in correspondence with FIG. 5A.

FIG. 5A is a cross-sectional diagram showing the scanning deflectors 413 and compensating deflectors 414 in the SEM dark field imaging system in accordance with an embodiment of the invention. FIG. 5B is a diagram of an electron trajectory in correspondence with FIG. 5A. As shown in FIG. 5B, the particle trajectory 504, the electron enters the detector's entrance plane 502 substantially on-axis with little or no radial slope. (In FIG. 5B, the labels "SD", "CD1", and "CD2" indicate the approximate positions of the scanning deflector and the two compensating deflectors, respectively.)

Figure 6:
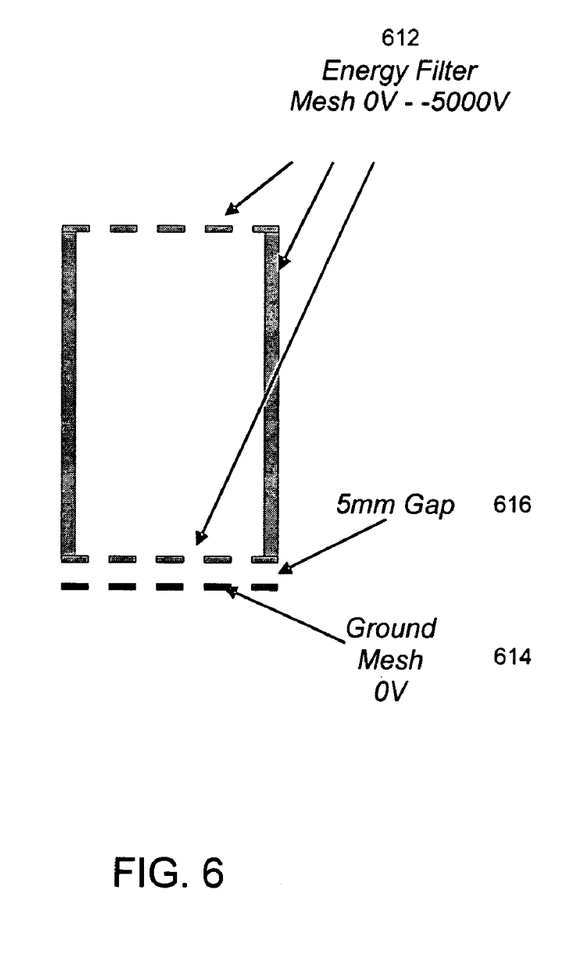
FIG. 6 depicts an energy filter component in accordance with an embodiment of the invention.

FIG. 6 depicts an energy filter component in accordance with an embodiment of the invention. In this embodiment, the energy filter 408 comprises a conductive or resistive energy filter drift tube 612 whose voltage may be varied, for example, between zero volts and minus 5000 volts. The tube 612 includes meshes on each end that are conductively coupled to the cylinder. In addition, on the detector side of the drift tube 612, there is a small gap 616 separating the tube 612 from a ground mesh 614.

In one embodiment, the voltage on the energy-filter drift tube 612 is set to be at the surface potential of the specimen. This may be done, for example, by a rapid voltage sweep to determine the cut-off voltage at which secondary electrons are no longer detected, followed by backing off the voltage to set the voltage for the energy-filter drift tube 612. This sweep/backoff procedure would be used if the specimen includes insulating portions (such as due to oxide) such that the surface potential is not known. If the surface potential is known (for example, due to the specimen being conductive), then the energy-filter voltage may be simply set ("dialed-in") to that voltage.

Figure 7A:
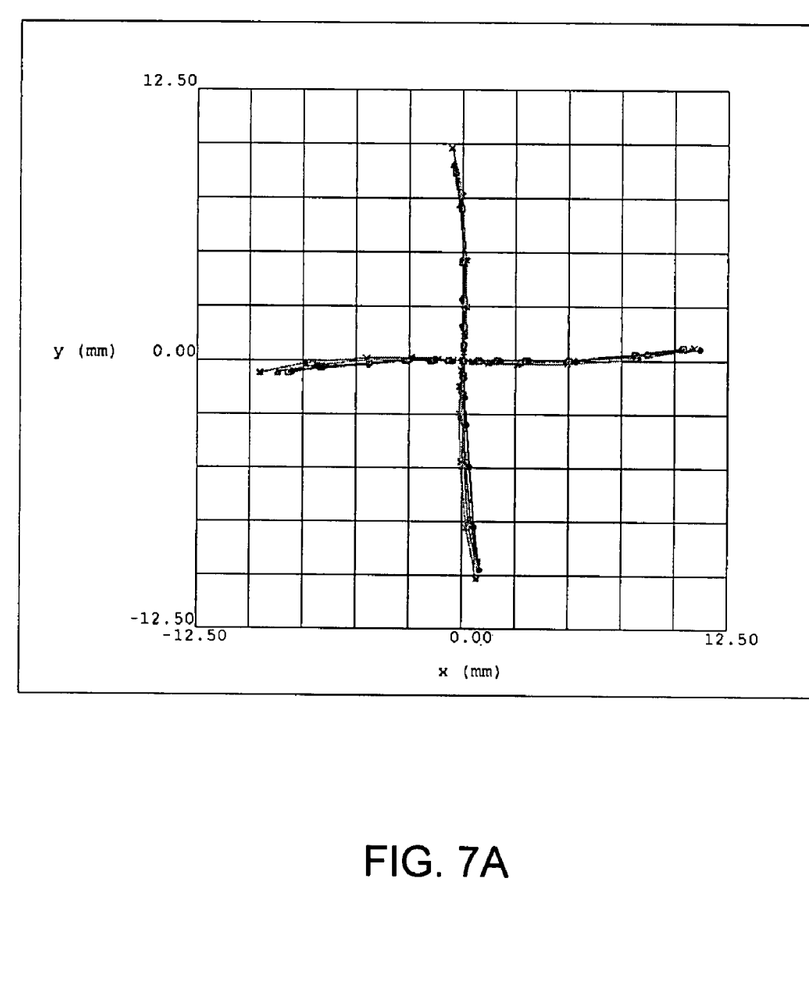
FIG. 7A is a diagram depicting electron landing positions in the plane of the detector for multiple electron energies at different polar angles in accordance with an embodiment of the invention.

FIG. 7A is a diagram depicting electron landing positions in the plane of the detector for multiple electron energies at different polar angles in accordance with an embodiment of the invention. The spot diagram is at the scintillator plate from a simulation including 1, 2, 5, and 10 electron volt secondary electrons. The points associated with each energy are connected together with lines and represent initial polar angles from 0 to 90 degrees in 5 degree increments per quadrant. The plots in each quadrant represent azimuthal angles of 0, 90, 180 and 270 degrees. The spot diagram of FIG. 7A indicates that by segmenting the detector, azimuth and polar angle discrimination may be achieved.

Figure 7B:
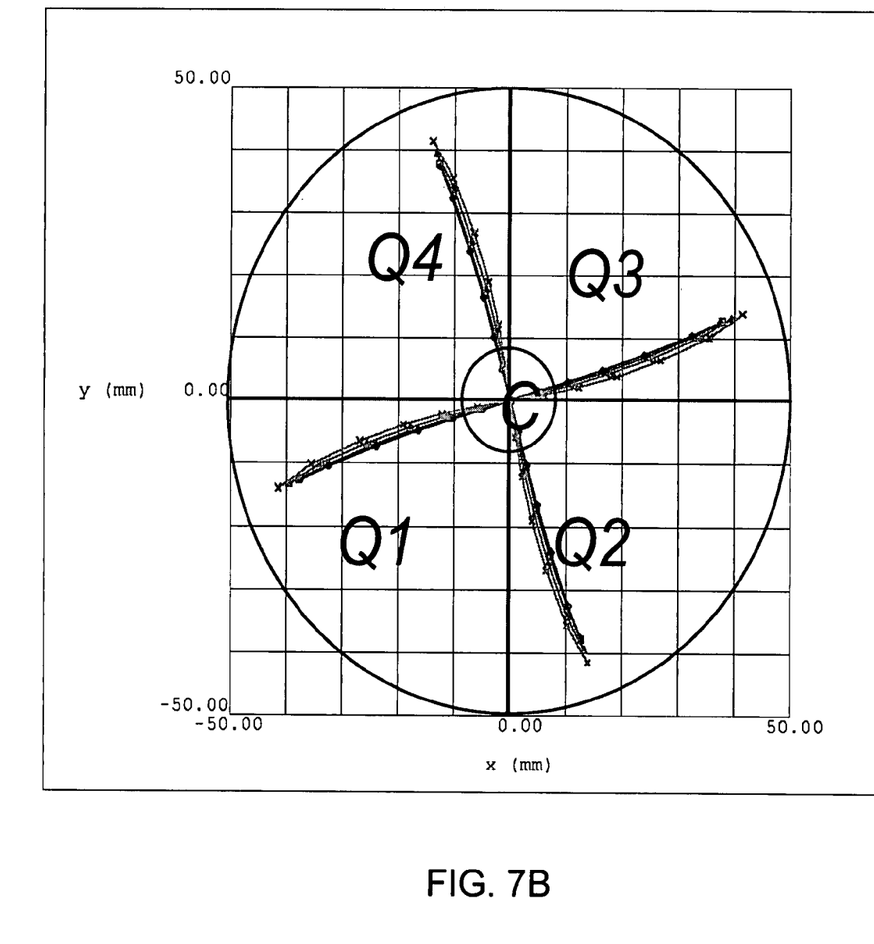
FIG. 7B is a diagram depicting an example detector segmentation in accordance with an embodiment of the invention.

FIG. 7B is a diagram depicting an example detector segmentation in accordance with an embodiment of the invention. The detector design of FIG. 7B is fairly simple, having a center segment C and four outer quadrants Q1, Q2, Q3, and Q4. In one implementation, the construction may be made using a 1" YAP crystal attached to a light-pipe that is segmented as shown in the diagram. Alternatively, a fiber bundle could be used. Five photomultiplier tubes would be used. Bright field and voltage contrast images may be acquired by summing detected data from all detector segments. Images may also be captured using one or more of the outer quadrants, or by calculating difference signals by subtracting one signal (or combination of signals) from another signal (or combination of signals).

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A scanning electron beam apparatus comprising:
an objective lens configured to focus an incident electron beam onto a specimen surface and to extract a secondary electron beam therefrom;
scan deflectors configured to deflect the incident electron beam so as to scan the incident electron beam over the specimen surface;
de-scan deflectors configured to deflect the secondary electron beam so as to compensate for the scanning of the incident electron beam;
an energy-filter drift tube positioned to receive the secondary electron beam after the de-scan deflectors; and
a segmented detector positioned to receive the secondary electron beam after the energy-filter drift tube,
wherein the segmentation of the detector provides angular discrimination based on electron landing positions.

2. The apparatus of claim 1, wherein the objective lens comprises an immersion lens configured with an extraction field so as to preserve azimuthal angle discrimination of the secondary electrons, and wherein the segmentation of the detector provides azimuthal angle discrimination.

3. The apparatus of claim 1, wherein the de-scan deflectors comprise quadrupole lenses.

4. The apparatus of claim 3, wherein the de-scan deflectors are configured so that the secondary electrons enter an entrance plane of the detector substantially on-axis and with little radial slope.

5. The apparatus of claim 1, wherein the energy-filter drift tube is configured to align electrons in the secondary electron beam according to polar angles of trajectory from the specimen surface, and wherein the segmentation of the detector provides polar angle discrimination.

6. The apparatus of claim 5, wherein the alignment according to polar angles is accomplished by allowing radial spreading of the electrons as a function of axial energy.

7. The apparatus of claim 5, wherein the energy-filter drift tube comprises a drift tube with energy-filter meshes at each end and a ground mesh separated by a gap.

8. The apparatus of claim 7, further comprising a variable voltage applied to the drift tube and an electrical ground applied to the ground mesh, wherein the variable voltage is set to a potential of the specimen surface.

9. The apparatus of claim 1, wherein the segmented detector comprises a YAP scintillator attached to a segmented light pipe.

10. The apparatus of claim 9, wherein the light pipe is segmented into center and outer segments, and wherein the segmentation between center and outer segments provides polar angle discrimination.

11. The apparatus of claim 10, wherein there are multiple outer segments providing azimuthal angle discrimination.

12. The apparatus of claim 10, wherein an imaging mode generates an image by adding together detected signals from all of the segments.

13. The apparatus of claim 12, wherein another imaging mode generates an image using a detected signal from one or more of the outer segments.

14. The apparatus of claim 12, wherein another imaging mode generates an image by calculating a difference between detected signals from at least two outer segments.

15. The apparatus of claim 1, further comprising an electrostatic lens configured to control a cone angle of the secondary electron beam.

16. The apparatus of claim 15, wherein the electrostatic lens is positioned between the specimen surface and the scan deflectors.

17. The apparatus of claim 15, wherein the electrostatic lens is positioned after the drift tube and before the detector.

18. The apparatus of claim 15, wherein the electrostatic lens is positioned after the de-scan deflectors and before the drift tube.

19. A method of imaging using a scanning electron beam; the method comprising:

deflecting an incident electron beam so as to scan the incident electron beam over a specimen surface;

focusing the incident electron beam onto the specimen surface;

extracting a secondary electron beam from the specimen surface;

deflecting the secondary electron beam so as to compensate for the scanning of the incident electron beam;

aligning electrons in the secondary electron beam according to polar angles of trajectory from the specimen surface; and detecting the secondary electron beam using a segmented detector, wherein the segmentation of the detector provides angular discrimination based on electron landing positions.

20. The method of claim 19, wherein an energy-filter drift tube is utilized to perform said aligning.

21. The method of claim 20, further comprising setting a voltage of the energy-filter drift tube to a potential of the specimen surface.

22. The method of claim 21, wherein the voltage is set using a voltage sweep to determine a cut-off voltage of secondary electron detection.

23. The method of claim 19, wherein an immersion objective lens system is utilized to perform said focusing and extracting and to preserve azimuth discrimination of electrons in the secondary electron beam.

24. The method of claim 19, wherein multipole lenses are utilized to perform said deflecting of the secondary electron beam.

25. A scanning electron microscope comprising:

means for deflecting an incident electron beam so as to scan the incident electron beam over a specimen surface;

means for focusing the incident electron beam onto the specimen surface;

means for extracting a secondary electron beam from the specimen surface;

means for deflecting the secondary electron beam so as to compensate for the scanning of the incident electron beam;

means for aligning electrons in the secondary electron beam according to polar angles of trajectory from the specimen surface; and means for detecting the secondary electron beam using a segmented detector;

wherein the segmentation of the detector provides angular discrimination based on electron landing positions.

* * * * *